United States Patent
Lagudu et al.

(10) Patent No.: US 8,462,026 B2
(45) Date of Patent: Jun. 11, 2013

(54) PULSE CODE MODULATION CONVERSION CIRCUIT AND METHOD

(75) Inventors: Sateesh Lagudu, Ameerpet (IN); Mahabaleswara Bhatt, Banjara Hills (IN); Padmavathi Devi Volety, Banjara Hills (IN)

(73) Assignee: ATI Technologies ULC, Markham, Ontario (CA)

( * ) Notice: Subject to any disclaimer, the term of this patent is extended or adjusted under 35 U.S.C. 154(b) by 714 days.

(21) Appl. No.: 12/639,171

(22) Filed: Dec. 16, 2009

(65) Prior Publication Data

US 2011/0116656 A1 May 19, 2011

(51) Int. Cl.
*H03M 7/00* (2006.01)

(52) U.S. Cl.
USPC .................. 341/61; 341/50; 341/51; 341/143

(58) Field of Classification Search
USPC ........................................ 341/50, 51, 143, 61
See application file for complete search history.

(56) References Cited

U.S. PATENT DOCUMENTS

| | | | | |
|---|---|---|---|---|
| 4,423,419 A * | 12/1983 | Johannessen | ................ | 342/387 |
| 4,507,659 A * | 3/1985 | Lewis et al. | ................... | 342/201 |
| 5,276,708 A * | 1/1994 | Heitmann | ..................... | 375/292 |
| 5,325,461 A * | 6/1994 | Tanaka et al. | ................. | 704/207 |
| 5,376,939 A * | 12/1994 | Urkowitz | ...................... | 342/134 |
| 5,445,065 A * | 8/1995 | Lopata | ......................... | 99/421 H |
| 6,031,601 A * | 2/2000 | McCusker et al. | .......... | 356/5.01 |
| 6,225,943 B1 * | 5/2001 | Curley et al. | ................. | 342/137 |
| 6,232,913 B1 * | 5/2001 | Lehtinen | ...................... | 342/137 |

\* cited by examiner

*Primary Examiner* — Jean B Jeanglaude
(74) *Attorney, Agent, or Firm* — Faegre Baker Daniels

(57) ABSTRACT

A circuit includes an enhanced frequency range linear pulse code modulation conversion circuit. The enhanced frequency range linear pulse code modulation conversion circuit is driven by a clock signal within a frequency range. The enhanced frequency range linear pulse code modulation conversion circuit provides enhanced frequency range linear pulse code modulated information. More specifically, the enhanced frequency range linear pulse code modulation conversion circuit is provided by selectively decimating and interpolating non-enhanced frequency range linear pulse code modulated information based on a desired output sampling frequency and the frequency range.

20 Claims, 4 Drawing Sheets

PULSE CODE MODULATION CONVERSION CIRCUIT AND METHOD

FIELD

The present disclosure generally relates to pulse code modulation conversion circuits, and more particularly, to converting pulse density information to pulse code information.

BACKGROUND

Microelectromechanical systems (MEMS) microphones that produce pulse density modulated (PDM) (e.g., an M times over-sampled single bit audio data generating digital microphone) in response to sound are becoming a popular replacement for conventional condenser microphones. In addition, many modern devices use audio signal processing algorithms (e.g., encoding and decoding algorithms) having Nyquist rated multi-bit resolution LPCM audio data. Therefore, many modern devices use audio signal processing algorithms (e.g., encoding and decoding algorithms) having Nyquist rated multi-bit resolution linear pulse code modulated (LPCM) audio data. As such, a conversion process is required to convert M times oversampled single bit data (e.g., PDM) to multi-bit Nyquist rated data (LPCM).

However, MEMS microphones (in addition to many other audio devices) are typically driven by a clock having a restricted range of clock frequencies. As such, in many MEMS microphones, the conversion to LPCM data having a Nyquist rate is not possible since MEMS microphones are driven with a clock having a restricted range of clock frequencies. For example, if the clock has a frequency range between 1 MHz to 4 MHz, a 64th order decimation process cannot provide LPCM data having sample rates below approximately 16 KHz and above approximately 64 KHz. As such, common audio processing frequencies (e.g., 8, 11.05, 12, 88.2, 96, 176.4 and 192 kHz) are excluded from LPCM data, which is undesirable.

Accordingly, a need exists for a circuit and method can provide LPCM data having sample rates that are unrestricted by the clock frequency ranges.

BRIEF DESCRIPTION OF THE DRAWINGS

The invention will be more readily understood in view of the following description when accompanied by the below figures, wherein like reference numerals represent like elements.

DETAILED DESCRIPTION

Figure 1:
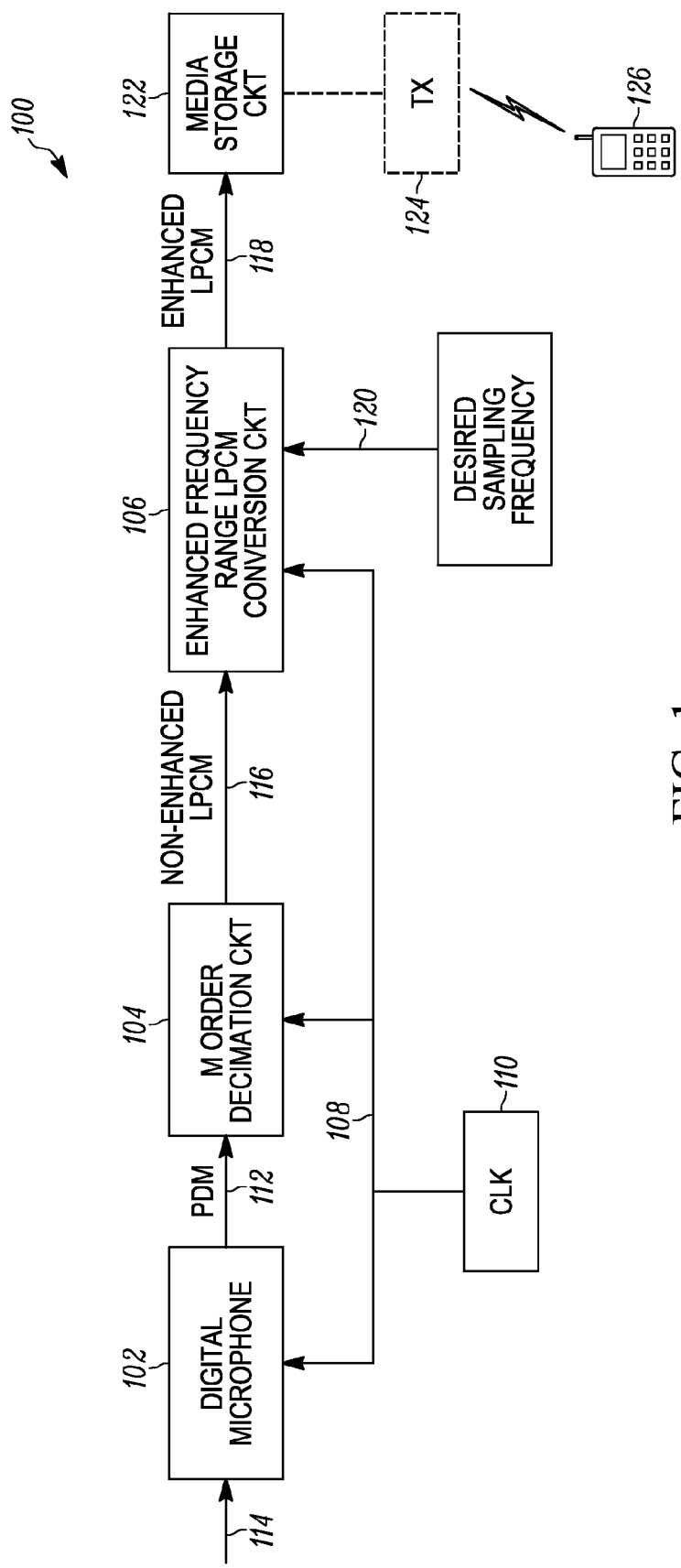
FIG. 1 is an exemplary functional block diagram of a device having an enhanced frequency range linear pulse code modulation conversion circuit.

In one example, a circuit includes an enhanced frequency range linear pulse code modulation conversion circuit. The enhanced frequency range linear pulse code modulation conversion circuit is driven by a clock signal within a frequency range. The enhanced frequency range linear pulse code modulation conversion circuit provides enhanced frequency range linear pulse code modulated information. More specifically, the enhanced frequency range linear pulse code modulation conversion circuit is provided by selectively decimating and interpolating non-enhanced frequency range linear pulse code modulated information based on a desired output sampling frequency and the frequency range. A related method is also disclosed.

The circuit and method provide, among other advantages, conversion of non-enhanced frequency range LPCM information having a limited frequency range (due to limitations of the clock) into the enhanced frequency range LPCM information 118 that does not have a limited frequency range. As such, for example, non-enhanced frequency range LPCM information having a sampling rate between 16 kHz and 64 kHz can be converted into enhanced frequency range LPCM information 118 having a sample rate above 64 kHz and below 16 kHz. Accordingly, due to converting the M times over-sampled single bit data into Nyquist sample rated multi-bit LPCM audio data, the circuit and method can provide LPCM information having common audio processing frequencies such as, for example, 8, 11.05, 12, 88.2, 96, 176.4 and 192 kHz. Other advantages will be recognized by those of ordinary skill in the art.

In one example, the enhanced frequency range linear pulse code modulation conversion circuit decimates the non-enhanced frequency range linear pulse code modulated information based on the desired output sampling frequency and a lowest frequency of the frequency range. The enhanced frequency range linear pulse code modulation conversion circuit interpolates the non-enhanced frequency range linear pulse code modulated information based on the desired output sampling frequency and a highest frequency of the frequency range. A related method is also disclosed.

In one example, the enhanced frequency range linear pulse code modulation conversion circuit includes a decimation filter circuit and an interpolation filter circuit. The decimation filter circuit provides the enhanced frequency range linear pulse code modulated information by decimating the non-enhanced frequency range linear pulse code modulated information. The interpolation provides the enhanced frequency range linear pulse code modulated information by interpolating the non-enhanced frequency range linear pulse code modulated information. In one example, the decimation filter circuit is a second order decimation filter circuit and/or the interpolation filter circuit is a second order interpolation circuit.

In one example, the circuit includes an M order decimation filter. The M order decimation filter provides the non-enhanced frequency range linear pulse code modulated information in response to pulse code modulated information. In one example, the enhanced frequency range linear pulse code modulation conversion circuit decimates the non-enhanced frequency range linear pulse code modulated information when the desired sampling frequency is less than a first ratio of the lowest frequency and M. The enhanced frequency range linear pulse code modulation conversion circuit interpolates the non-enhanced frequency range linear pulse code modulated information when desired sampling frequency is greater than a second ratio the highest frequency and M.

In one example, a device includes a digital microphone, an M order decimation filter circuit, and the enhanced frequency range linear pulse code modulation conversion circuit. The digital microphone, which is driven by a clock signal within a frequency range, provides pulse code modulated information. The M order decimation filter circuit, which is also driven by the clock signal, provides non-enhanced frequency range linear pulse code modulated information in response to the pulse code modulated information. The enhanced frequency range linear pulse code modulation conversion circuit, which is also driven by the clock signal, provides enhanced frequency range linear pulse code modulated information by selectively decimating and interpolating non-enhanced frequency range linear pulse code modulated information based on a desired output sampling frequency and the frequency range.

In one example, a computer readable medium includes information that when executed by at least one processor causes the at least one processor to operate, design, and/or organize the circuit. In one example, the information comprises data representing hardware description language.

As used herein, the term "circuit" can include an electronic circuit, one or more processors (e.g., shared, dedicated, or group of processors such as but not limited to microprocessors, DSPs, or central processing units) and memory that execute one or more software or firmware programs, combinational logic circuits, an ASIC, and/or other suitable components that provide the described functionality. Additionally, as will be appreciated by those of ordinary skill in the art, the operation, design, and organization, of a "circuit" can be described in a hardware description language such as Verilog™, VHDL, or other suitable hardware description languages.

Referring now to FIG. 1, an exemplary functional block diagram of a device 100 such as a wireless phone, a mobile and/or stationary computer, a printer, a LAN interface (wireless and/or wired), a media player, a video decoder and/or encoder, and/or any other suitable digital device is depicted. The device 100 includes a digital microphone 102 such as a microelectromechanical systems (MEMS) microphone device or other suitable microphone device, an M order decimation filter circuit 104, and an enhanced frequency range linear pulse code modulation (LPCM) conversion circuit 106. The digital microphone 102, the M order decimation filter circuit 104, and the enhanced frequency range LPCM conversion circuit 106 are driven by a clock signal 108 that operates between a low frequency (e.g., 1 MHz) and a high frequency (e.g., 4 MHz) within a frequency range. As such, in some embodiments, the device 100 can also include a clock circuit 110 to provide the clock signal 108.

During operation, the digital microphone 102 provides a pulse density modulated (PDM) signal 112 in response to sound waves 114 such as speech and/or other suitable audible sound. The M order decimation filter circuit 104 provides non-enhanced frequency range LPCM information 116 in response to the PDM information 112. More specifically, the M order decimation filter circuit 104 performs an Mth order decimation process on the PDM information 112 in order to provide the non-enhanced frequency range LPCM information 116. In one embodiment, the M order decimation filter circuit 104 can perform a 64th order decimation process to provide the non-enhanced frequency range LPCM information 116.

The non-enhanced frequency range LPCM information 116 has a limited frequency range due to the frequency range of the clock signal 108. For example, if the clock signal 108 has a frequency range between 1 MHz to 4 MHz, a 64th order decimation process cannot provide LPCM data having sample rates below 16 kHz and above 64 kHz. As such, in this example, the non-enhanced frequency range LPCM information 116 is limited to sample rates between 16 KHz and above 64 KHz and is thus missing common audio processing frequencies (e.g., 8, 11.05, 12, 88.2, 96, 176.4 and 192 kHz).

The enhanced frequency range LPCM conversion circuit 106 provides enhanced frequency range LPCM information 118 in response to the non-enhanced frequency range LPCM information 116. More specifically, the enhanced frequency range LPCM conversion circuit 106 provides the enhanced frequency range linear pulse code modulated information 118 by selectively decimating and interpolating non-enhanced frequency range LPCM information 116 based on a desired sampling frequency 120 and the frequency range of the clock signal 108. For example, if the desired sampling frequency 120 is less than a lowest frequency of the frequency range (e.g., less than approximately 16 kHz for the clock signal 108 having a frequency of approximately 1 MHz and using 64th order decimation), the enhanced frequency range LPCM conversion circuit 106 can decimate the non-enhanced frequency range LPCM information 116. However, if for example, the desired sampling frequency 120 is greater than a highest frequency of the frequency range (e.g., greater than 64 kHz), the enhanced frequency range LPCM conversion circuit 106 can interpolate the non-enhanced frequency range LPCM information 116. As such, the enhanced frequency range LPCM conversion circuit 106 can convert M times oversampled single bit data into Nyquist sample rated multi-bit LPCM audio data. IN the event that the desired sampling frequency 120 is within the frequency range (e.g., between approximately 16 kHz and 64 kHz), the enhanced frequency range LPCM conversion circuit 106 passes through the non-enhanced frequency range LPCM information 116 in order to provide the enhanced frequency range LPCM information 118.

In some embodiments, the enhanced frequency range LPCM conversion circuit 106 decimates the non-enhanced frequency range LPCM information 116 when the desired sampling frequency is less than a ratio of the lowest clock frequency and M (e.g., 16 kHz or 1 MHz/64). In addition, the enhanced frequency range LPCM conversion circuit 106 interpolates the non-enhanced frequency range LPCM information 116 when the desired sampling frequency is greater than a ratio of the highest clock frequency and M (e.g., 64 kHz or 4 MHz/64).

In addition, in some embodiments, the device 100 can include a media storage circuit 122 to store the enhanced frequency range LPCM information 118. The media storage circuit 122 can be any suitable storage circuit such as, for example, volatile or non-volatile memory or other suitable storage circuit. The media storage circuit 122 can be used to temporarily or permanently store the enhanced frequency range LPCM information 118 for future use.

In some embodiments (e.g., a wireless phone), the device 100 can also include a transmitter 124 to transmit the enhanced frequency range LPCM information 118 to another device 126 such a wireless phone, base station, and/or other suitable device. The transmitter 124 can receive the enhanced frequency range LPCM information 118 from the enhanced frequency range LPCM conversion circuit 106 or from the media storage circuit 122.

Figure 2:
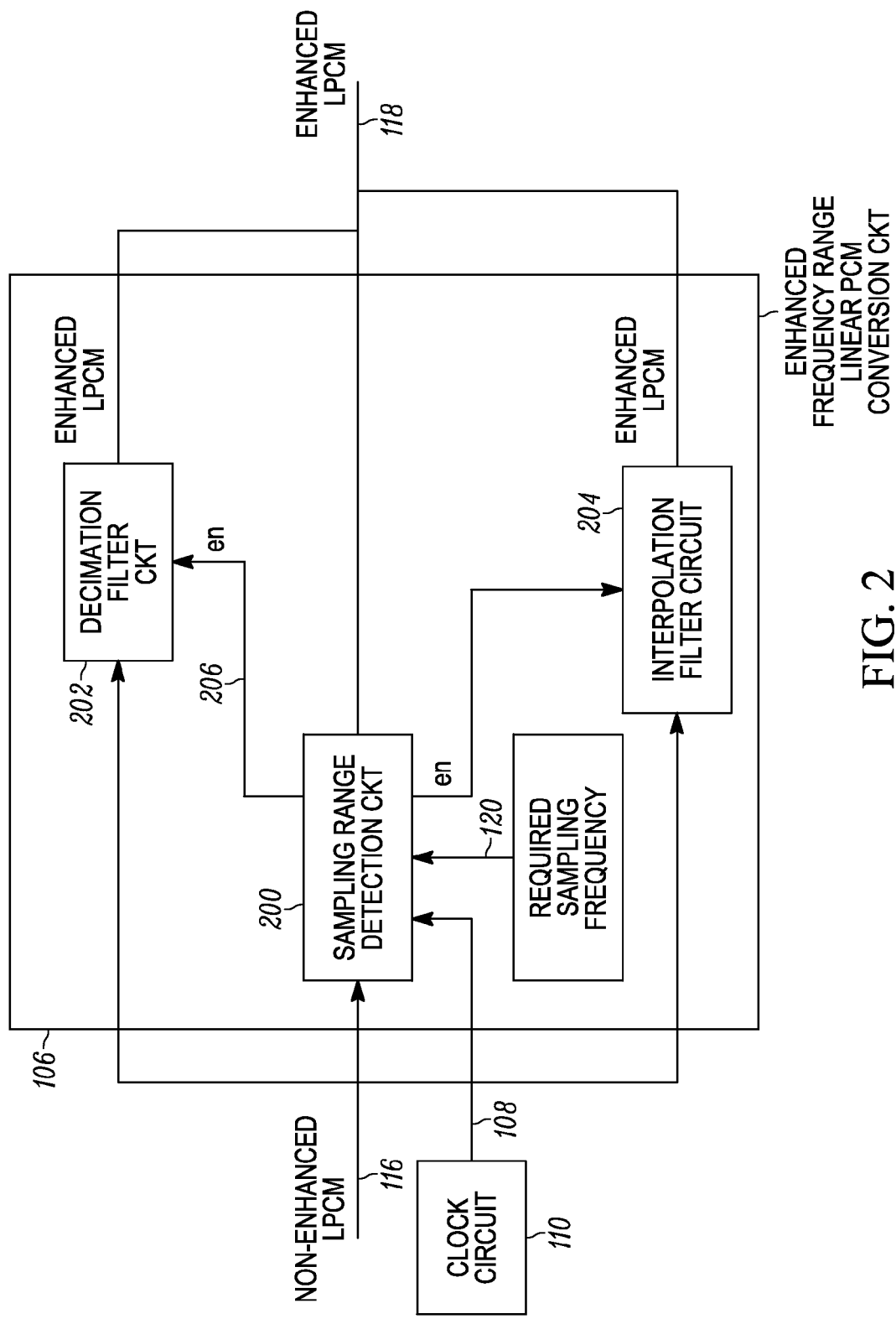
FIG. 2 is an exemplary functional block diagram of the enhanced frequency range linear pulse code modulation conversion circuit.

Referring now to FIG. 2, an exemplary functional block diagram of the enhanced frequency range LPCM conversion circuit 106 is depicted. The enhanced frequency range LPCM conversion circuit 106 includes a sampling range detection circuit 200, a decimation filter circuit 202, and an interpolation filter circuit 204. The sampling range detection circuit 200 compares the clock signal 108 to the desired sampling frequency 120 to determine whether to decimate, interpolate, or pass-through the non-enhanced frequency range LPCM information 116. More specifically, the sampling range detection circuit 200 determines whether the desired sampling frequency 120 is less than the lowest frequency of the frequency range (e.g., less than 16 kHz), greater than the highest frequency of the frequency range (e.g., greater than 64 kHz), and/or between the lowest and highest frequency of the frequency range (e.g., between 16 kHz and 64 kHz). In some embodiments, the sampling range detection circuit 200 determines whether the desired sampling frequency 120 is less than a first ratio of the lowest frequency and M (e.g., 16 kHz or 1 MHz/64), greater than a second ratio of the highest frequency and M (e.g., 64 kHz or 4 MHz/64), and/or between the first and second ratio.

If the desired sampling frequency 120 is between the lowest and highest frequency of the frequency range (or between the first and second ratio), the sampling range detection circuit 200 provides the enhanced frequency range LPCM information 118 in response to the non-enhanced frequency range LPCM information 116. In some embodiments, the sampling range detection circuit 200 can simply pass through the non-enhanced frequency range LPCM information 116 to provide the enhanced frequency range LPCM information 118 when the desired sampling frequency 120 is between the lowest and highest frequency of the frequency range (or between the first and second ratio).

If the desired sampling frequency 120 is less than the lowest frequency of the frequency range (or the first ratio), the sampling range detection circuit 200 enables the decimation filter circuit 202 via, for example, a decimation enable signal 206. In response to the decimation enable signal 206, the decimation filter circuit 202 provides the enhanced frequency range LPCM information 118 by decimating the non-enhanced frequency range LPCM information 116. In some embodiments, the decimation filter circuit 202 is a second order decimation filter circuit and therefore performs a second order decimation process on the non-enhanced frequency range LPCM information 116 in order to provide the enhanced frequency range LPCM information 118. However, other order decimation filter circuits are contemplated.

If the desired sampling frequency 120 is greater than the highest frequency of the frequency range (or the second ratio), the sampling range detection circuit 200 enables the interpolation filter circuit 204 via, for example, an interpolation enable signal 208. In response to the interpolation enable signal 208, the interpolation filter circuit 204 provides the enhanced frequency range LPCM information 118 by interpolating the non-enhanced frequency range LPCM information 116. In some embodiments, the interpolation filter circuit 204 is a second order interpolation filter circuit and therefore performs a second order interpolation process on the non-enhanced frequency range LPCM information 116 in order to provide the enhanced frequency range LPCM information 118. However, other order interpolation filter circuits are contemplated.

Figure 3:
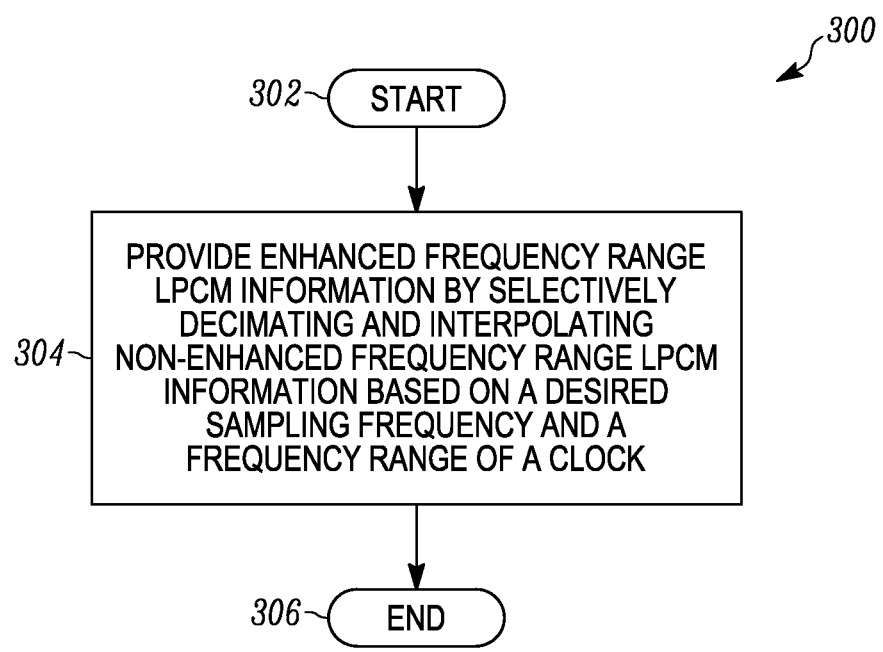
FIG. 3 is a flowchart depicting exemplary operations that can be performed by the enhanced frequency range linear pulse code modulation conversion circuit.

Referring now to FIG. 3, exemplary operations that can be performed by the enhanced frequency range LPCM conversion circuit 106 are generally identified at 300. The process starts at 302 when the enhanced frequency range LPCM conversion circuit 106 receives the non-enhanced frequency range LPCM information 116. At 304, the enhanced frequency range LPCM conversion circuit 106 provides the enhanced frequency range LPCM information 118 by selectively decimating and interpolating the non-enhanced frequency range LPCM information 116 based on the desired sampling frequency 120 and the frequency range of the clock signal 108 provided by clock circuit 100. The process ends at 306.

Figure 4:
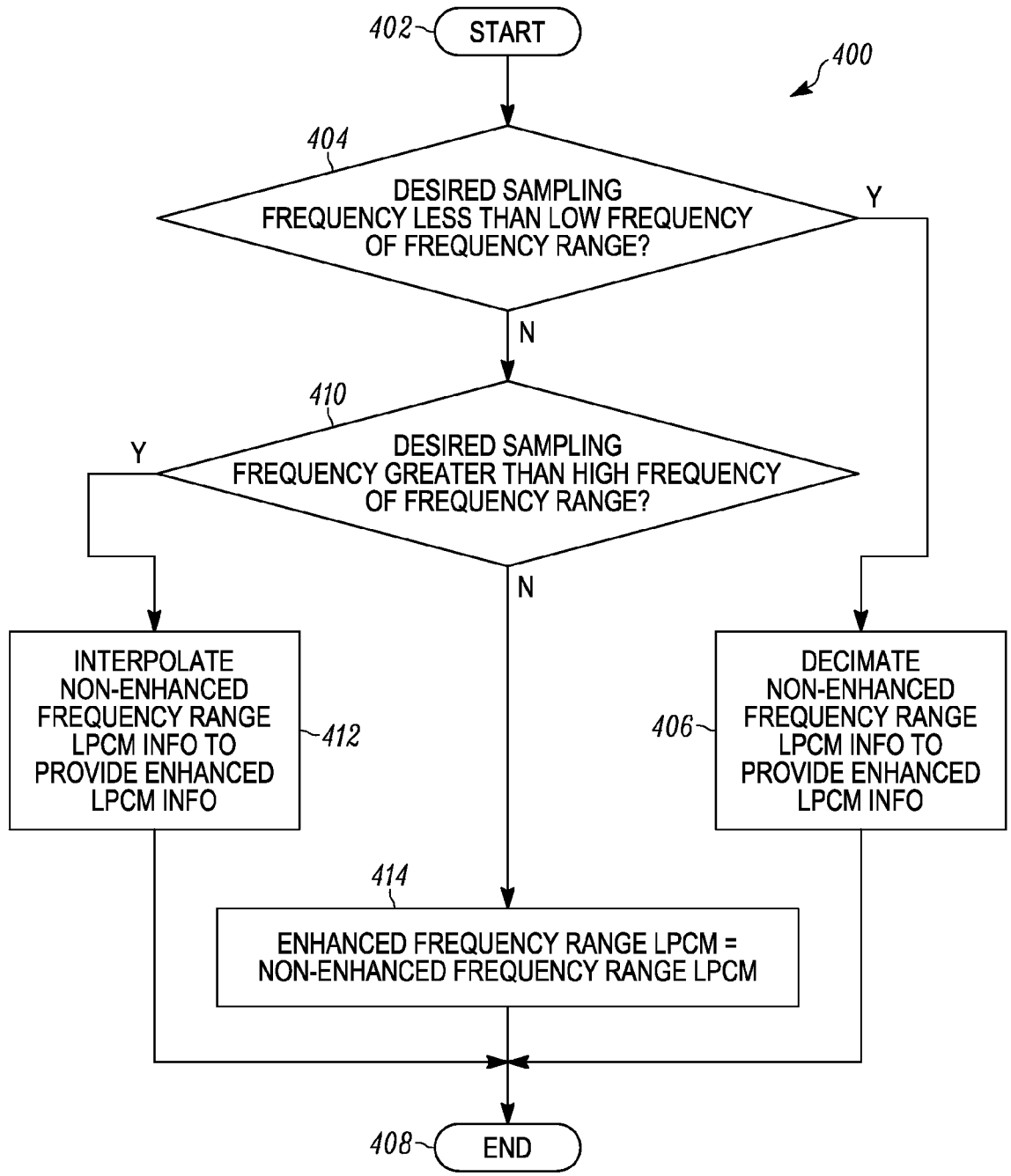
FIG. 4 is a flowchart depicting additional exemplary operations that can be performed by the enhanced frequency range linear pulse code modulation conversion circuit.

Referring now to FIG. 4, additional exemplary operations that can be performed by the enhanced frequency range LPCM conversion circuit 106 are generally identified at 400. The process starts at 402 when the enhanced frequency range LPCM conversion circuit 106 receives the non-enhanced frequency range LPCM information 116. At 404, the sampling range detection circuit 200 determines whether the desired sampling frequency 120 is less than the lowest frequency of the frequency range (or the first ratio). If the desired sampling frequency 120 is less than the lowest frequency of the frequency range (or the first ratio), the decimation filter circuit 202 decimates the non-enhanced frequency range LPCM information 116 to provide the enhanced frequency range LPCM information 118 at 406 and the process ends at 408.

However, if the sampling range detection circuit 200 determines that the desired sampling frequency 120 is not less than the lowest frequency of the frequency range (or the first ratio) at 404, the process proceeds to 410. At 410, the sampling range detection circuit 200 determines whether the desired sampling frequency 120 is greater than the highest frequency of the frequency range (or the second ratio). If the desired sampling frequency 120 is greater than the highest frequency of the frequency range (or the second ratio), the interpolation filter circuit 204 interpolates the non-enhanced frequency range LPCM information 116 to provide the enhanced frequency range LPCM information 118 at 412 and the process ends at 408.

If the sampling range detection circuit 200 determines that the desired sampling frequency 120 is not greater than the highest frequency of the frequency range (or the second ratio) at 404, the process proceeds to 414. At 414, enhanced frequency range LPCM conversion circuit 106 provides the non-enhanced frequency range LPCM information 116 as the enhanced frequency range LPCM information 118. More specifically, as noted above, in some embodiments, the sampling range detection circuit 200 can pass through the non-enhanced frequency range LPCM information 116 as the enhanced frequency range LPCM information 118 when the desired sampling frequency 120 is between the highest frequency of the frequency range (or the second ratio) and the lowest frequency of the frequency range (or the first ratio). The process ends at 408.

As noted above, among other advantages, the enhanced frequency range LPCM conversion circuit 106 converts the non-enhanced frequency range LPCM information 116 having a limited frequency range (due to limitations of the clock 110) into the enhanced frequency range LPCM information 118 that does not have a limited frequency range. As such, for example, non-enhanced frequency range LPCM information 116 having a sampling rate between 16 kHz and 64 kHz can be converted into enhanced frequency range LPCM information 118 having a sample rate above 64 kHz and below 16 kHz. Accordingly, due to converting the M times oversampled single bit data into Nyquist sample rated multi-bit LPCM audio data, the enhanced frequency range LPCM conversion circuit 106 can provide LPCM information having common audio processing frequencies such as, for example, 8, 11.05, 12, 88.2, 96, 176.4 and 192 kHz. Other advantages will be recognized by those of ordinary skill in the art.

While this disclosure includes particular examples, it is to be understood that the disclosure is not so limited. Numerous modifications, changes, variations, substitutions, and equivalents will occur to those skilled in the art without departing from the spirit and scope of the present disclosure upon a study of the drawings, the specification, and the following claims.

What is claimed is:

1. A circuit comprising an enhanced frequency range linear pulse code modulation conversion circuit, driven by a clock signal within a frequency range, that is operative to provide enhanced frequency range linear pulse code modulated information by selectively decimating and interpolating non-enhanced frequency range linear pulse code modulated information based on a desired sampling frequency and the frequency range.

2. The circuit of claim 1 wherein the enhanced frequency range linear pulse code modulation conversion circuit is operative to:
decimate the non-enhanced frequency range linear pulse code modulated information based on the desired sampling frequency and a lowest frequency of the frequency range; and
interpolate the non-enhanced frequency range linear pulse code modulated information based on the desired sampling frequency and a highest frequency of the frequency range.

3. The circuit of claim 1 wherein the enhanced frequency range linear pulse code modulation conversion circuit comprises:
a decimation filter circuit that is operative to provide the enhanced frequency range linear pulse code modulated information by decimating the non-enhanced frequency range linear pulse code modulated information; and
an interpolation filter circuit that is operative to provide the enhanced frequency range linear pulse code modulated information by interpolating the non-enhanced frequency range linear pulse code modulated information.

4. The circuit of claim 3 wherein at least one of: the decimation filter circuit is a second order decimation filter circuit and the interpolation filter circuit is a second order interpolation circuit.

5. The circuit of claim 1 further comprising an M order decimation filter that is operative to provide the non-enhanced frequency range linear pulse code modulated information in response to pulse code modulated information.

6. The circuit of claim 5 wherein the enhanced frequency range linear pulse code modulation conversion circuit:
decimates the non-enhanced frequency range linear pulse code modulated information when the desired sampling frequency is less than a first ratio of the lowest frequency and M; and
interpolates the non-enhanced frequency range linear pulse code modulated information when desired sampling frequency is greater than a second ratio the highest frequency and M.

7. A method comprising providing enhanced frequency range linear pulse code modulated information by selectively decimating and interpolating non-enhanced frequency range linear pulse code modulated information based on a desired sampling frequency and a frequency range of a clock.

8. The method of claim 7 further comprising:
decimating the non-enhanced frequency range linear pulse code modulated information based on the desired sampling frequency and a lowest frequency of the frequency range; and
interpolating the non-enhanced frequency range linear pulse code modulated information based on the desired sampling frequency and a highest frequency of the frequency range.

9. The method of claim 7 further comprising:
providing the enhanced frequency range linear pulse code modulated information by decimating the non-enhanced frequency range linear pulse code modulated information; and
providing the enhanced frequency range linear pulse code modulated information by interpolating the non-enhanced frequency range linear pulse code modulated information.

10. The method of claim 9 wherein at least one of: the non-enhanced frequency range linear pulse code modulated information is decimated using a second order decimation filter circuit and the non-enhanced frequency range linear pulse code modulated information is interpolated using a second order interpolation circuit.

11. The method of claim 7 wherein the non-enhanced frequency range linear pulse code modulated information is provided by an M order decimation filter in response to pulse code modulated information.

12. The method of claim 11 further comprising:
decimating the non-enhanced frequency range linear pulse code modulated information when the desired sampling frequency is less than a first ratio of the lowest frequency and M; and
interpolating the non-enhanced frequency range linear pulse code modulated information when desired sampling frequency is greater than a second ratio the highest frequency and M.

13. A device comprising:
a digital microphone, driven by a clock signal within a frequency range, that is operative to provide pulse density modulated information;
an M order decimation filter circuit, driven by the clock signal, that is operative to provide non-enhanced frequency range linear pulse code modulated information in response to the pulse density modulated information; and
an enhanced frequency range linear pulse code modulation conversion circuit, driven by the clock signal, that is operative to provide enhanced frequency range linear pulse code modulated information by selectively decimating and interpolating non-enhanced frequency range linear pulse code modulated information based on a desired sampling frequency and the frequency range.

14. The device of claim 13 wherein the enhanced frequency range linear pulse code modulation conversion circuit comprises:
a decimation filter circuit that is operative to provide the enhanced frequency range linear pulse code modulated information by decimating the non-enhanced frequency range linear pulse code modulated information; and
an interpolation filter circuit that is operative to provide the enhanced frequency range linear pulse code modulated information by interpolating the non-enhanced frequency range linear pulse code modulated information.

15. The circuit of claim 14 wherein at least one of: the decimation filter circuit is a second order decimation filter circuit and the interpolation filter circuit is a second order interpolation circuit.

16. The circuit of claim 13 wherein the enhanced frequency range linear pulse code modulation conversion circuit:
decimates the non-enhanced frequency range linear pulse code modulated information when the desired sampling frequency is less than a first ratio of the lowest frequency and M; and
interpolates the non-enhanced frequency range linear pulse code modulated information when desired sampling frequency is greater than a second ratio the highest frequency and M.

17. A non-transitory computer readable medium comprising information that when executed by at least one processor causes the at least one processor to:

at least one of: operate and organize a circuit that comprises:

an enhanced frequency range linear pulse code modulation conversion circuit, driven by a clock signal within a frequency range, that is operative to provide enhanced frequency range linear pulse code modulated information by selectively decimating and interpolating non-enhanced frequency range linear pulse code modulated information based on a desired sampling frequency and the frequency range.

18. The computer readable medium of claim 17 wherein the enhanced frequency range linear pulse code modulation conversion circuit comprises:

a decimation filter circuit that is operative to provide the enhanced frequency range linear pulse code modulated information by decimating the non-enhanced frequency range linear pulse code modulated information; and an interpolation filter circuit that is operative to provide the enhanced frequency range linear pulse code modulated information by interpolating the non-enhanced frequency range linear pulse code modulated information.

19. The computer readable medium of claim 18 wherein at least one of: the decimation filter circuit is a second order decimation filter circuit and the interpolation filter circuit is a second order interpolation circuit.

20. The computer readable medium of claim 17 wherein the information comprises data representing hardware description language.

* * * * *